US010490383B2

United States Patent
Bel

(10) Patent No.: US 10,490,383 B2
(45) Date of Patent: Nov. 26, 2019

(54) EQUILIBRATION OF A MULTIBEAM INDUCTIVE OUTPUT TUBE

(71) Applicant: THALES, Courbevoie (FR)

(72) Inventor: Claude Bel, Maxilly sur Leman (FR)

(73) Assignee: THALES, Courbevoie (FR)

( * ) Notice: Subject to any disclaimer, the term of this patent is extended or adjusted under 35 U.S.C. 154(b) by 0 days.

(21) Appl. No.: 15/766,349

(22) PCT Filed: Oct. 3, 2016

(86) PCT No.: PCT/EP2016/073548
§ 371 (c)(1),
(2) Date: Apr. 5, 2018

(87) PCT Pub. No.: WO2017/060189
PCT Pub. Date: Apr. 13, 2017

(65) Prior Publication Data
US 2018/0294132 A1    Oct. 11, 2018

(30) Foreign Application Priority Data
Oct. 7, 2015 (FR) ..................................... 15 02085

(51) Int. Cl.
*H03F 1/00* (2006.01)
*H01J 25/04* (2006.01)
(Continued)

(52) U.S. Cl.
CPC ............ *H01J 25/04* (2013.01); *H01J 23/027* (2013.01); *H01J 23/04* (2013.01); *H01J 23/06* (2013.01); *H01J 23/16* (2013.01); *H03F 3/02* (2013.01)

(58) Field of Classification Search
CPC ................. H03F 1/00; H03F 3/54; H03F 3/58
(Continued)

(56) References Cited

U.S. PATENT DOCUMENTS 2,647,994 A * 8/1953 Weiss ..................... G01S 7/28
331/4
4,789,808 A * 12/1988 Hayashi ................... G05F 1/52
315/4
(Continued)

FOREIGN PATENT DOCUMENTS

EP     0 883 152 A2    12/1998
FR     2 860 916 A1    4/2005

OTHER PUBLICATIONS

R. Lawrence Ives, "Development of a 200 MHz 30 MW Multiple Beam Inductive Output Tube Final Report," Jun. 19, 2008, XP055292528.
(Continued)

Primary Examiner — Henry Choe
(74) Attorney, Agent, or Firm — Baker & Hostetler LLP

(57) ABSTRACT

A multibeam-inductive-output-tube amplifier comprises an output cavity and a plurality of electron guns each intended to emit an electron beam through the output cavity, each electron gun comprising a cathode intended to emit the electron beam and a gate allowing the density of the electron beam to be modulated. The amplifier comprises, associated with each gun, a DC voltage supply, each of the supplies connected to the gate of the corresponding electron gun so as to bias the gate. The voltage of at least one of the supplies is adjustable so as to balance the density of the various electron beams.

7 Claims, 2 Drawing Sheets

(51) Int. Cl.
*H01J 23/16* (2006.01)
*H01J 23/027* (2006.01)
*H01J 23/04* (2006.01)
*H01J 23/06* (2006.01)
*H03F 3/02* (2006.01)

(58) Field of Classification Search
USPC .................................................. 330/44, 49
See application file for complete search history.

(56) References Cited

U.S. PATENT DOCUMENTS

| | | | | |
|---|---|---|---|---|
| 6,300,715 | B1* | 10/2001 | Clerc | H01J 23/14 |
| | | | | 315/5.32 |
| 7,671,687 | B2* | 3/2010 | LeChevalier | H01J 3/36 |
| | | | | 315/364 |
| 2012/0205534 | A1* | 8/2012 | Hunter | H01J 49/0013 |
| | | | | 250/282 |
| 2013/0211789 | A1* | 8/2013 | Dong | H03M 9/00 |
| | | | | 702/198 |
| 2017/0316928 | A1* | 11/2017 | Hunter | H01J 49/0013 |

OTHER PUBLICATIONS

R.L. Ives et al., "350 MHZ, 200 KW CW multiple beam inductive output tube," 2011 Abstracts IEEE International Conference on Plasma Science (ICOPS), Jun. 1, 2011, XP055292537.

* cited by examiner

EQUILIBRATION OF A MULTIBEAM INDUCTIVE OUTPUT TUBE

CROSS-REFERENCE TO RELATED APPLICATIONS

This application is a National Stage of International patent application PCT/EP2016/073548, filed on Oct. 3, 2016, which claims priority to foreign French patent application No. FR 1502085, filed on Oct. 7, 2015, the disclosures of which are incorporated by reference in their entirety.

FIELD OF THE INVENTION

The invention relates to an inductive-output-tube amplifier. Such tubes are well known in the literature as IOTs. The tube includes, in a vacuum chamber, a gun that generates an electron beam that passes through an anode and an interaction space before reaching a collector. The interaction space is located in a resonant cavity. An input signal input level with the electron gun is amplified level with the resonant cavity. Inductive output tubes are in particular used in the last amplification stage of radiofrequency signals, the output of the tube being connected to a load such as for example an accelerating cavity.

BACKGROUND

The electron gun includes a cathode and a control gate, between which a radiofrequency signal to be amplified is applied, this signal modulating the energy of the electron beam. In the interaction space, some of the kinetic energy of the electron beam is converted into electromagnetic-wave form in the resonant cavity.

Multibeam tubes exist. These tubes are known in the literature as multiple beam inductive output tubes (MBIOTs). More precisely, in order to increase the power output from the tube, it is possible to make provision for a plurality of electron beams to interact with a single resonant cavity. The various beams are each generated by one electron gun. The gates of the various guns receive the same radiofrequency signal to be amplified.

SUMMARY OF THE INVENTION

The invention aims to improve the performance and in particular the overall efficiency of a multibeam tube and to do so, the applicant realized that efficiency was related to the balance of the density of the various electron beams. For a given radiofrequency signal applied as input to the various electron guns, each must deliver the same peak current. During the manufacture of a tube, geometric dispersions necessarily occur. These dispersions cause density to vary between the beams emitted by the various guns.

One solution consists in decreasing manufacturing tolerances, but this tends to increase the manufacturing cost of a tube.

The invention aims to mitigate this problem while accepting larger manufacturing tolerances. The invention provides a solution allowing the density of the various beams to be balanced independently of geometric dispersions.

To this end, the one subject of the invention is an amplifier comprising a multibeam inductive output tube comprising an output cavity and a plurality of electron guns that are each intended to emit an electron beam through the output cavity, each electron gun comprising a cathode that is intended to emit the electron beam and a gate allowing the density of the electron beam to be modulated, the amplifier furthermore comprising, associated with each gun, a DC voltage supply, each of the supplies being connected to the gate of the corresponding electron gun so as to bias the gate, the voltage of at least one of the supplies being adjustable so as to balance the density of the various electron beams.

The supplies associated with each electron gun are for example called first supplies. The amplifier furthermore comprises a second DC voltage supply the voltage of which is adjustable, the first supplies each being connected in series between the corresponding gate and the second supply, the voltage of the second supply being adjustable so as to apply, to the various gates, a blocking voltage.

The amplifier may furthermore comprise, associated with each of the electron guns, a collector, each collector being intended to receive the corresponding electron beam after it has passed through the output cavity, a current sensor allowing a current flowing through each of the collectors to be measured.

Another subject of the invention is a method for adjusting an amplifier according to the invention, the method consisting in measuring a current flowing through each of the collectors and in adjusting the voltage of each of the first supplies in order to equalize the measured values of the currents.

Advantageously, a target value is defined for the current measured in each of the collectors so as to limit the heating of each of the collectors.

A voltage may be applied to one of the gates, this voltage allowing a target value to be achieved for the current measured in each of the collectors during a fraction of a time period.

The time period is advantageously repeated and an average of the current measurements taken during each of the fractions is calculated.

BRIEF DESCRIPTION OF THE DRAWINGS

The invention will be better understood and further advantages will become apparent upon reading the detailed description of one embodiment given by way of example, which description is illustrated by the attached drawing in which.

For the sake of clarity, the same elements have been given the same references in the various figures.

DETAILED DESCRIPTION

Figure 1:
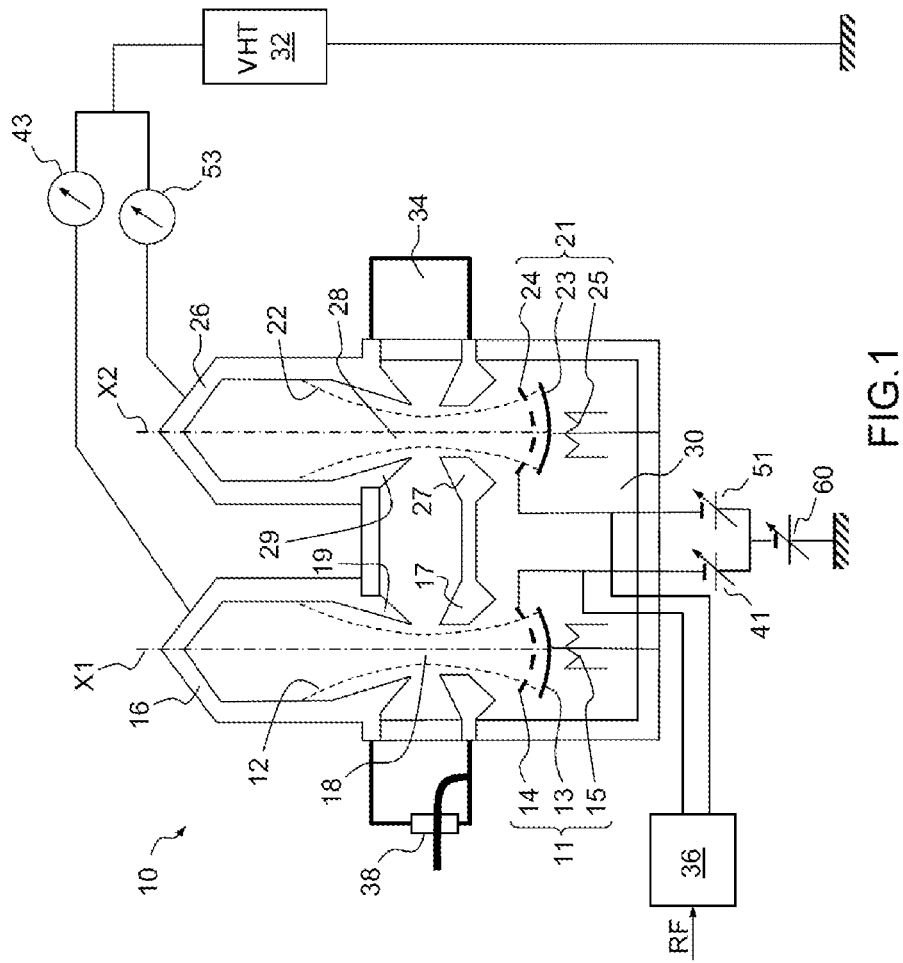
FIG. 1 schematically shows an amplifier according to the invention.

FIG. 1 shows an amplifier 10 intended to amplify a radiofrequency signal by means of a vacuum tube. It will be recalled, briefly, that a vacuum tube uses the principle of interaction between an electron beam and an electromagnetic wave to transmit, to the wave, some of the energy contained in the electron beam, so as to obtain, as output from the tube, a wave of higher energy than the wave input into the tube. The frequency of the radiofrequency signal is for example in the UHF band. Other frequency bands may of course be employed in the context of the invention.

The amplifier 10 comprises, by way of example, two electron guns 11 and 21 that each emit a beam, 12 and 22, respectively, in a vacuum chamber 30. The number of guns has been chosen in order not to overload the figure. It is of course possible to implement the invention with a larger number of guns. The applicant has for example carried out conclusive internal trials with an amplifier possessing ten electron guns. The gun 11 is constructed about an axis X1 along which the electron beam 12 propagates. The gun 11 is placed at a first end of the axis X1. The gun 11 comprises a cathode 13 that emits the electrons, and a gate 14 that controls the flux of electrons dependent on a voltage that is applied thereto. A heating electrode 15 allows the cathode 13 to be heated. The electron beam 12 propagates as far as to a collector 16 placed at a second end of the axis X1.

The amplifier 10 comprises a VHT supply 32 allowing a voltage difference of several tens of kilovolts to be applied between the cathode 13 and the collector 16. In practice, the collector 16 may include a plurality of stages (not shown) each raised to a different voltage.

Along the axis X1, the amplifier 10 comprises a beak-shaped anode 17 that leads onto an interaction space 18 of an output resonant cavity 34. The interaction space 18 is bounded by a second interaction beak 19 that faces the beak 18 and that belongs to the collector 16.

The electron gun 21 is constructed about the axis X2 and comprises, just like the gun 11, a heating electrode 25, a cathode 23 and a gate 24. The amplifier 10 also comprises an anode 27 that is passed through by the beam 22, and a collector 26 that is intended to receive the beam 22 emitted by the gun 21. The collector 26 and the gun 22 both extend along an axis X2. The two axes X1 and X2 are for example parallel. Other configurations in which the axes X1 and X2 are not parallel are also possible in the context of the invention.

In order to standardize the manufacture of the amplifier 10, the two guns 11 and 21, the two anodes 17 and 27 and the two collectors 16 and 26 are advantageously identical.

The output resonant cavity 34 is common to the two electron beams 12 and 22.

The amplifier 10 comprises a splitter 36 allowing the radiofrequency signal RF to be amplified to be split between the two gates 14 and 24 in a balanced fashion.

In operation, the density of the electron beam 12 is modulated by the gate 14 and the electrons are emitted in the form of bunches. The time between two bunches is equal to the period of the RF signal. The beam 12 is substantially cylindrical about the axis X1, between the anode 17 and the collector 16. This cylindrical shape is obtained by virtue, on the one hand, of the shape of the cathode 13, of the anode 17 and of the gate 14, and, on the other hand, by virtue of an axial magnetic field that keeps the electrons close to the axis X1. The electron bunches originating from the gate 14 are accelerated before entering into the interaction space 18. The electric field present in the interaction space 18 tends to slow the electron bunches. The kinetic energy lost by the electrons is converted into electromagnetic energy in the cavity 34. The electron beam 22 develops in the same way as the beam 12. Some of the kinetic energy of the beam 22 is also converted into electromagnetic energy in the cavity 34. The electromagnetic energy extracted from the two beams 12 and 22 is directed to the output of the amplifier 10 for example via a coaxial feed passing through an insulator 38 in the wall of the cavity 34.

The amplifier 10 furthermore comprises, associated with each gun 11 and 21, a DC voltage supply, 41 and 51, respectively, each of the supplies being connected to the gate 14 or 24 of the corresponding electron gun 11 or 21 so as to bias the gate. The voltage of the supplies 41 and 51 is adjustable so as to balance the density of the various beams 12 and 22.

It is possible to complete by adding the amplifier 10 thereto another DC voltage supply 60 that is common to the various guns 11 and 21. The voltage of each of the supplies 41 and 51 is added to that of the supply 60. The supply 41 is connected in series between the gate 14 and the supply 60. Likewise, the supply 51 is connected in series between the gate 24 and the supply 60. The presence of the supply 60 allows adjustment of the blocking voltage of the various beams to be facilitated.

It is possible to adjust the voltage of the various supplies 41, 51 and 60 by analyzing the signal output from the amplifier. Another simpler way consists in measuring the currents flowing through each of the collectors 16 and 26. To this end, the collectors 16 and 26 are produced separately and may be electrically insulated from one another so as to measure, separately, the current generated by each of the beams 12 and 22 in each of the collectors 16 and 26. Two separate electrical conductors connect each of the collectors 16 and 26 to the VHT supply 32 and the amplifier comprises current sensors 43 and 53 that allow the current flowing through each of the conductors to be measured separately. In other words, the sensor 43 allows the current flowing through the collector 16 to be measured and the sensor 53 allows the current flowing through the collector 26 to be measured. Any type of sensor may be used to measure these currents, such as for example Hall-effect sensors measuring the magnetic field generated by the current flowing through the conductor connecting the collector in question to the VHT supply 32.

Figure 2:
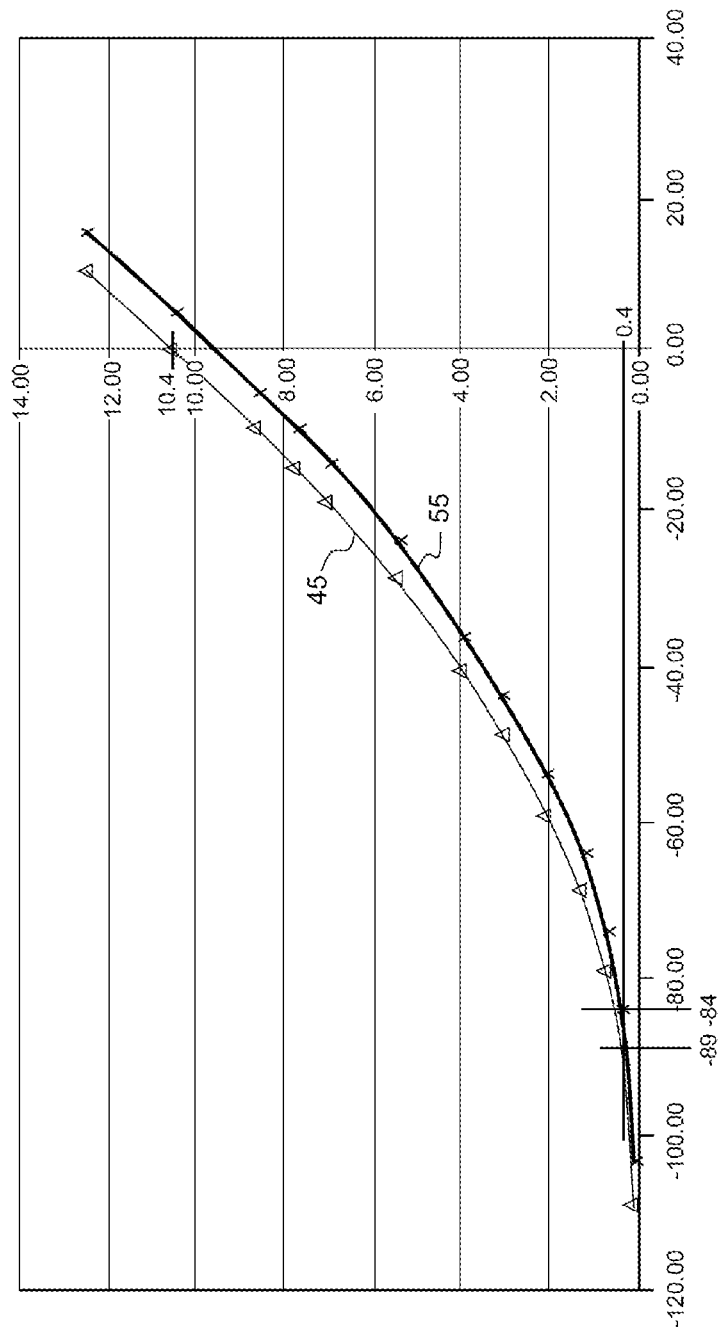
FIG. 2 shows characteristic curves representative of the operation of a plurality of electron guns of the amplifier of FIG. 1.

FIG. 2 shows two examples of characteristic curves 45 and 55 each associated with one of the guns 11 and 21, respectively. More precisely, the curves 45 and 55 show the variation in the current flowing through the collector as a function of the voltage applied to the gate in question 14 or 24. For each of the curves 45 and 55, the current increases as a function of the voltage applied to the gate. For a gate voltage of about −110 V the current is zero, and for a voltage of 0 V the current is about 10 A. The two curves 45 and 55 are offset horizontally. This offset is mainly due to geometric dispersions of the two electron guns 11 and 21. In practice, all the other mechanical parts playing a role in the establishment of the two beams 12 and 22 may be a source of current variations in the collectors 16 and 26.

The two characteristic curves 45 and 55 were established for the application of RF signals to the gates 14 and 24. The value of the currents remains the same in case of application of a DC voltage to the gate in question. The DC voltage may complement the RF AC voltage. By varying the voltage values of the two supplies 41 and 51, it is therefore possible to balance the two electron guns 11 and 21 so that, for a given RF input power, the currents of the two beams 12 and 22 are equal.

Simply, in the absence of RF signal, each of the two voltages of the supplies 41 and 51 is adjusted so that the current value measured by the two sensors 43 and 53 is the same. The derivative of the curves 45 and 55 increases with gate voltage. In other words, the slope of the curves 45 and 55 increases with gate voltage. The choice of the magnitude of the current to be achieved in the collectors 16 and 26 must be sufficiently high to obtain a sufficient ratio between the voltage variation and current variation to allow the voltage to be finely adjusted. Moreover, on application of a DC voltage to each of the gates 14 and 24, almost all of the energy contained in the electron beams 12 and 22 is transferred to the collectors 16 and 26, almost without transfer of kinetic energy to the cavity 34. Therefore, in order to limit heating of the collectors 16 and 26, it is necessary to limit the magnitude of the current in each of the collectors. In practice, a DC current of about 4% of the maximum current allows adjustment without excessive heating of the collector. In the example shown in FIG. 2, according to the curve 45, a voltage of 0 V applied to the gate 14 generates a current of 10.5 A in the collector 16 and a voltage of −89 V generates a current of 0.4 A. Firstly, the voltage of the supply 41 is adjusted to −89 V in order to obtain a current of a target value of 0.4 A. Alternatively, as the target value of the current is an arbitrary value, the supply 41 may have a set voltage.

It is then sought to determine the voltage to be applied to the gate 24 in order to obtain the same current of 0.4 A in the collector 26. It is possible to set the potential of the gate also to −89 V. At this voltage value, a current lower than 0.4 A is measured in the collector 26. As it is known that the curve 55 is an increasing function of gate voltage, the voltage of the supply 51 applied to the gate 24 is increased until the value of 0.4 A is achieved in the collector 26. In the example shown, the current of 0.4 A in the collector 26 is achieved with a DC voltage of −84 V for the supply 51.

This method may be improved in order to increase the precision of adjustment of the voltages of the supplies 41 and 51. In order to limit heating in the collectors 16 and 26, it is possible to apply a voltage to one of the gates 14 and 24 only during a fraction of a period. The thermal inertia of the collectors 16 and 26 then allows the heating over the period to be smoothed. The fraction of the period is defined so as to allow a correct measurement of the current in the collector. For example, using a Hall-effect sensor as a current sensor, a period fraction of about 1 to 2 ms allows the measurement in the sensor in question to be stabilized. Excluding the fraction for which the voltage is applied to the gate, and for the rest of the period, the voltage applied to the gate may be more negative in order to generate no current in the collector in question. It is possible to repeat the application of the voltage for example at a frequency of 1 to 10 Hz in order to refine the measurement of current in the collector, for example by calculating a mean of the various measurements taken.

After the voltage of the two supplies 41 and 51 has been adjusted, the supply 60 common to the two guns 11 and 21 is adjusted. The voltage of the supply 60 adds to the two voltages adjusted beforehand. The supply 60 is adjusted so as to cancel out the current in the collectors. This voltage, in addition to the voltage of each of the supplies 41 and 51, is called the blocking voltage. In other words, for the gun 11, the blocking voltage is the sum of the voltages of the supplies 41 and 60. For the gun 21, the blocking voltage is the sum of the voltages of the supplies 51 and 60. In the example shown, the voltage of the supply 60 is −25 V. The gate 14 is biased to its blocking voltage $Vp_{14}$, which is:

$$Vp_{14} = (-89\ V) + (-25\ V) = -114\ V$$

Likewise, the gate 24 is biased to its blocking voltage $Vp_{24}$, which is:

$$Vp_{24} = (-84\ V) + (-25\ V) = -109\ V.$$

Alternatively, it is possible to do without the supply 60. The voltage of each of the supplies 41 and 51 is then offset by the same value in order to achieve the desired bias voltage.

After the various gates have been biased, it is possible to apply, to each of the gates, in addition to its bias voltage, the voltage $V_{RF} \cdot \cos \omega t$ of the RF signal. During use of the amplifier 10, the voltage $Vg_{24}$ applied to the gate 14 is:

$$Vg_{14} = Vp_{14} + V_{RF} \cdot \cos \omega t$$

$$Vg_{24} = Vp_{24} + V_{RF} \cdot \cos \omega t$$

The voltage $V_{RF}$ is the amplitude of the RF signal. If it is desired not to exceed a collector current of 10.5 A, the maximum amplitude of the RF signal is 109 V in order to obtain a maximum voltage of 0 V for the gate 14 and a maximum voltage of +5 V for the gate 24. For a given amplitude of the RF signal, for example 109 V, a given peak current, i.e. 10.4 A, is delivered by each of the guns 11 and 21.

The invention claimed is:

1. An amplifier comprising:
   a multibeam inductive output tube comprising an output cavity: and
   a plurality of electron guns that are each intended to emit an electron beam through the output cavity, each electron gun comprising:
   a cathode that is intended to emit the electron beam, and
   a gate in a path of the electron beam allowing the density of the electron beam to be modulated: and
   a DC voltage supply associated with each gun, each DC voltage supply being connected to the gate of the corresponding electron gun so as to bias the gate, the voltage of at least one DC voltage supply being adjustable so as to balance the density of the various electron beams.

2. The amplifier as claimed in claim 1, wherein the supplies associated with each electron gun are called first supplies and furthermore comprising a second DC voltage supply the voltage of which is adjustable, the first supplies each being connected in series between the corresponding gate and the second supply, the voltage of the second supply being adjustable so as to apply, to the various gates, a blocking voltage.

3. The amplifier as claimed in claim 1, further comprising, associated with each of the electron guns, a collector, each collector being intended to receive the corresponding electron beam after it has passed through the output cavity, a current sensor allowing a current flowing through each of the collectors to be measured.

4. A method for adjusting an amplifier as claimed in claim 1, comprising measuring a current flowing through each of the collectors and in adjusting the voltage of each of the first supplies in order to equalize the measured values of the currents.

5. The method as claimed in claim 4, wherein a target value is defined for the current measured in each of the collectors so as to limit the heating of each of the collectors.

6. The method as claimed in claim 4, wherein a voltage is applied to one of the gates, this voltage allowing a target value to be achieved for the current measured in each of the collectors during a fraction of a time period.

7. The method as claimed in claim 6, wherein the time period is repeated and wherein an average of the current measurements taken during each of the fractions is calculated.

* * * * *